(12) United States Patent
Chen et al.

(10) Patent No.: US 11,997,888 B2
(45) Date of Patent: May 28, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Hung Chen, Kaohsiung (TW); Sheng-Yu Chen, Kaohsiung (TW); Chang-Lin Yeh, Kaohsiung (TW); Yung-I Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 235 days.

(21) Appl. No.: 17/549,784

(22) Filed: Dec. 13, 2021

(65) Prior Publication Data

US 2022/0102453 A1 Mar. 31, 2022

Related U.S. Application Data

(63) Continuation of application No. 16/550,110, filed on Aug. 23, 2019, now Pat. No. 11,201,200.

(51) Int. Cl.
*H10K 59/129* (2023.01)
*H01L 25/16* (2023.01)
*H01L 27/15* (2006.01)
*H01L 29/786* (2006.01)
(Continued)

(52) U.S. Cl.
CPC ........... *H10K 59/129* (2023.02); *H01L 25/16* (2013.01); *H01L 25/167* (2013.01);
(Continued)

(58) Field of Classification Search
CPC .... H10K 59/125; H10K 59/129; H10K 50/30; H10B 10/125; H01L 27/156;
(Continued)

(56) References Cited

U.S. PATENT DOCUMENTS 7,886,432 B2 2/2011 Sakai et al.
8,791,474 B1 7/2014 Bibl et al.
(Continued)

OTHER PUBLICATIONS

Final Office Action for U.S. Appl. No. 16/550,110, dated May 13, 2021, 13 pages.
(Continued)

*Primary Examiner* — Michael M Trinh
(74) *Attorney, Agent, or Firm* — FOLEY & LARDNER LLP

(57) ABSTRACT

A semiconductor device package includes a display device, an electronic module and a conductive adhesion layer. The display device includes a first substrate and a TFT layer. The first substrate has a first surface and a second surface opposite to the first surface. The TFT layer is disposed on the first surface of the first substrate. The electronic module includes a second substrate and an electronic component. The second substrate has a first surface facing the second surface of the first substrate and a second surface opposite to the first surface. The electronic component is disposed on the second surface of the second substrate. The conductive adhesion layer is disposed between the first substrate and the second substrate.

16 Claims, 12 Drawing Sheets

(51) Int. Cl.
*H10B 10/00* (2023.01)
*H10K 50/30* (2023.01)
*H10K 59/125* (2023.01)

(52) U.S. Cl.
CPC .......... *H01L 27/156* (2013.01); *H01L 29/786* (2013.01); *H10B 10/125* (2023.02); *H10K 50/30* (2023.02); *H10K 59/125* (2023.02)

(58) Field of Classification Search
CPC ............. H01L 27/3255; H01L 27/1108; H01L 27/3274; H01L 51/5296; H01L 25/16; H01L 25/167; H01L 25/50; H01L 29/786
See application file for complete search history.

(56) References Cited

U.S. PATENT DOCUMENTS

| | | |
|---|---|---|
| 9,508,784 B2 | 11/2016 | Akimoto et al. |
| 10,037,981 B2 | 7/2018 | Banna et al. |
| 2014/0049702 A1* | 2/2014 | Li .................... G02F 1/13338 349/12 |
| 2014/0247200 A1 | 9/2014 | Jinta et al. |
| 2016/0095221 A1 | 3/2016 | Ramachandran et al. |
| 2017/0170152 A1* | 6/2017 | Wi ........................ H01L 33/56 |
| 2017/0207249 A1* | 7/2017 | Rhee ................... H01L 27/1248 |
| 2017/0358562 A1* | 12/2017 | Banna ..................... H01L 25/50 |
| 2019/0148440 A1* | 5/2019 | Chen ................ H01L 27/14636 257/290 |
| 2019/0157234 A1* | 5/2019 | Fathi ........................ B32B 5/18 |

OTHER PUBLICATIONS

Non-Final Office Action for U.S. Appl. No. 16/550,110, dated Oct. 29, 2020, 9 pages.
Notice of Allowance for U.S. Appl. No. 16/550,110, dated Aug. 12, 2021, 9 pages.

* cited by examiner

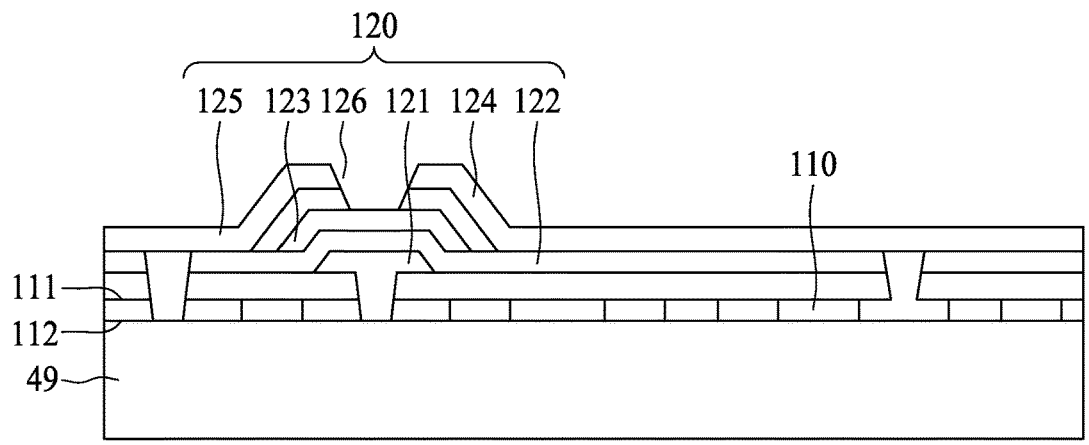
FIG. 4A
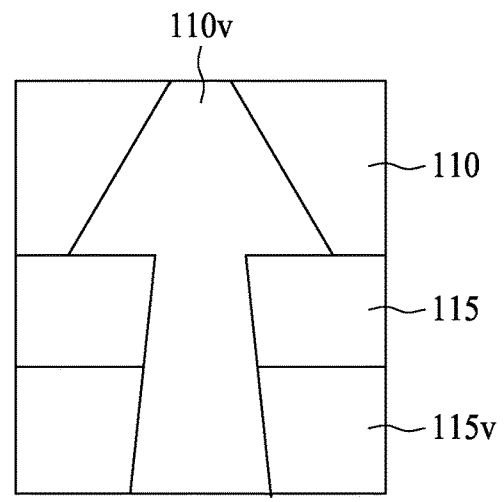
FIG. 4A'
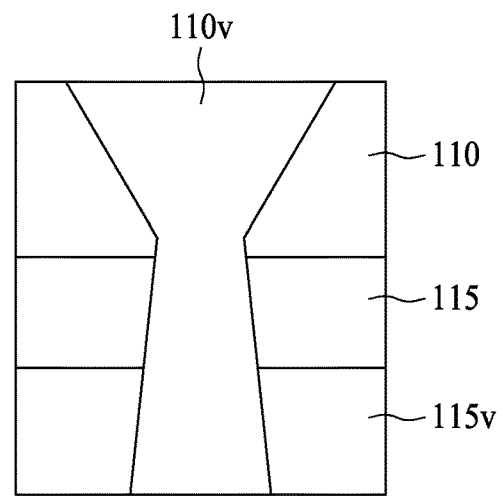
FIG. 4A"

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/550,110 filed Aug. 23, 2019, the contents of which is incorporated herein by reference in its entirety.

BACKGROUND

1. Technical Field

The present disclosure generally relates to a semiconductor device package and a method of manufacturing the same, and to a semiconductor device package including a display device, and a method of manufacturing the same.

2. Description of the Related Art

A wearable electronic component (e.g., an electronic watch, band or the like) generally has a band attached to a housing which accommodates some electronic components. Extra function(s) may be specified for integration into the watch (geographic information collection or determination; biological information collection or determination, etc.), which means more components (such as Global Positioning System (GPS) module, heart rate sensing module, etc.) should be introduced into the housing. As a result, size and weight of the housing may inevitably increase, which may adversely affect user's experience

SUMMARY

In accordance with an aspect of the present disclosure, a semiconductor device package includes a display device, an electronic module and a conductive adhesion layer. The display device includes a first substrate and a TFT layer. The first substrate has a first surface and a second surface opposite to the first surface. The TFT layer is disposed on the first surface of the first substrate. The electronic module includes a second substrate and an electronic component. The second substrate has a first surface facing the second surface of the first substrate and a second surface opposite to the first surface. The electronic component is disposed on the second surface of the second substrate. The conductive adhesion layer is disposed between the first substrate and the second substrate.

In accordance another aspect of the present disclosure, a method of manufacturing a semiconductor device package includes (a) providing a display device having a first substrate and a TFT layer on a first surface of the first substrate; (b) providing an electronic module having a second substrate and an electronic component disposed on a first surface of the second substrate facing away from the first substrate; and (c) applying a conductive adhesion layer between the first substrate and the second substrate to connect a second surface of the first substrate opposite to the first surface of the first substrate to a second surface of the second substrate opposite to the first surface of the second substrate.

Figure 1A:
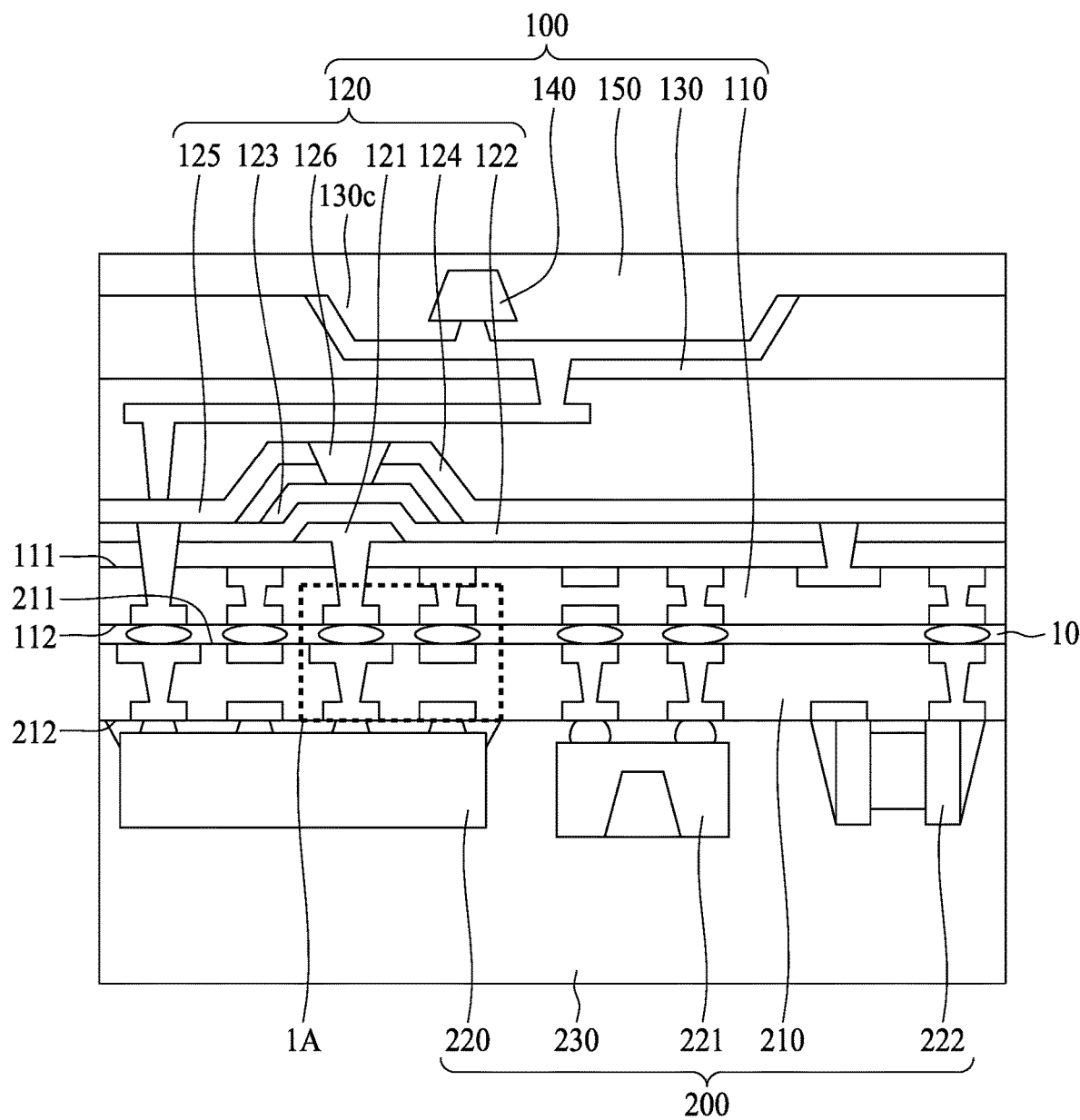
FIG. 1A illustrates a cross-sectional view of a semiconductor device package in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes a display device 100, an electronic module 200 and a connection layer 10 (or bonding layer). In some embodiments, the semiconductor device package 1 can be used or implemented in a bendable or flexible electronic component (e.g., an electronic watch, an electronic band or the like).

The display device 100 includes substrates 110, 130, a thin film transistor (TFT) layer 120, a light emitting device 140 and an encapsulant 150. The substrate 110 may include, for example, a printed circuit board, such as a paper-based copper foil laminate, a composite copper foil laminate, or a polymer-impregnated glass-fiber-based copper foil laminate. The substrate 110 may include an interconnection structure, such as a redistribution layer (RDL) or a grounding element. The substrate 110 includes a surface 111 and a surface 112 opposite to the surface 111. In some embodiments, the substrate 110 is a flexible substrate.

The TFT layer 120 is disposed on the surface 111 of the substrate 110. In some embodiments, as shown in FIG. 1A, the TFT layer 120 may be or include a driving circuit electrically connected to the light emitting device 140. For example, the driving circuit is configured to send a driving current (or voltage) to the light emitting device 140, and the light emitting device 140 is driven by the driving current to emit light with a luminance that corresponds to a magnitude of the driving current. Various kinds of circuits can serve as the driving circuit for driving the light emitting device 140. For example, the driving circuit may include a plurality of transistors and at least one storage capacitor. For example, the driving circuit can include a drive configuration indicated as a 5T/1C type, a 4T/1C type, a 3T/1C type, a 2T/1C type or the like, where T represents a transistor and C represents a storage capacitor. In some embodiments, as shown in FIG. 1A, the transistor of the driving circuit may include a gate 121, a gate insulator (e.g., dielectric material) 122, a semiconductor channel 123, a drain 124, a source 125 and a passivation layer 126. In some embodiments, the structure of the transistor of the driving circuit can be changed or adjusted depending on different design specifications. In some embodiments, the TFT layer 120 and the substrate 110 may be collectively referred to as a back plate.

The substrate 130 is disposed on the TFT layer 120. The substrate 130 may include, for example, a printed circuit board, such as a paper-based copper foil laminate, a composite copper foil laminate, or a polymer-impregnated glass-fiber-based copper foil laminate. The substrate 130 may include an interconnection structure, such as a RDL or a grounding element. The substrate 130 includes a cavity 130c to accommodate the light emitting device 140. In some embodiments, a depth of the cavity 130c can be larger, equal to or less than the thickness of the light emitting device 140 depending on different design specifications.

The light emitting device 140 is disposed within the cavity 130c of the substrate 130. The light emitting device 140 is electrically connected to the TFT layer 120 through the substrate 130 (e.g., through the interconnection structure of the substrate 130). In some embodiments, the light emitting device 140 may be or include a micro light emitting diode (LED). In some embodiments, the light emitting 140 may be or include a liquid-crystal display (LCD), an organic light emitting diode (OLED) or any other suitable light emitting units. In some embodiments, the light emitting device 140 and the substrate 130 may be collectively referred to as a front plate.

The encapsulant 150 is disposed on the substrate 130 and within the cavity 130c of the substrate 130. The encapsulant 150 covers the light emitting device 140 to protect the light emitting device 140. In some embodiments, the encapsulant 150 is formed of or includes a light transparent material to allow the light emitted by the light emitting device 140 passing through.

The electronic module 220 includes a substrate 210, electronic components 220, 221, 222 and a package body 230. In some embodiments, the electronic module 220 can be referred to as a system-in-package (SiP) module. The substrate 210 may include, for example, a printed circuit board, such as a paper-based copper foil laminate, a composite copper foil laminate, or a polymer-impregnated glass-fiber-based copper foil laminate. The substrate 210 may include an interconnection structure, such as a RDL or a grounding element. The substrate 210 includes a surface 211 facing the substrate 110 and a surface 212 opposite to the surface 211. In some embodiments, the substrate 210 is a flexible substrate.

The electronic components 220, 221 and 222 are disposed on the surface 212 of the substrate 210. The electronic component 220, 221 and 222 may be or include an active component, a passive component and/or a combination thereof. For example, the electronic component 220 may be a chip or a die including a semiconductor substrate, one or more integrated circuit devices and one or more overlying interconnection structures therein. For example, the electronic component 221 may be a sensor or a microelectromechanical systems (MEMS). For example, the electronic component 222 may be a capacitor. The electronic components 220, 221 and 222 are electrically connected to each other or connected to the display device 100 through the substrate 210 (e.g., the interconnection structure).

The package body 230 is disposed on the surface 212 of the substrate 210 and covers the electronic components 220, 221 and 222. In some embodiments, the package body 230 includes an epoxy resin having fillers dispersed therein.

The connection layer 10 (e.g., a conductive adhesion layer) is disposed between the display device 100 and the electronic module 200. For example, the connection 10 is disposed between the substrate 110 and the substrate 210. The connection layer 10 connects (or bonds) the display device 100 with the electronic module 200. The connection layer 10 provides electrical connections between the display device 100 and the electronic module 200.

Figure 1B:
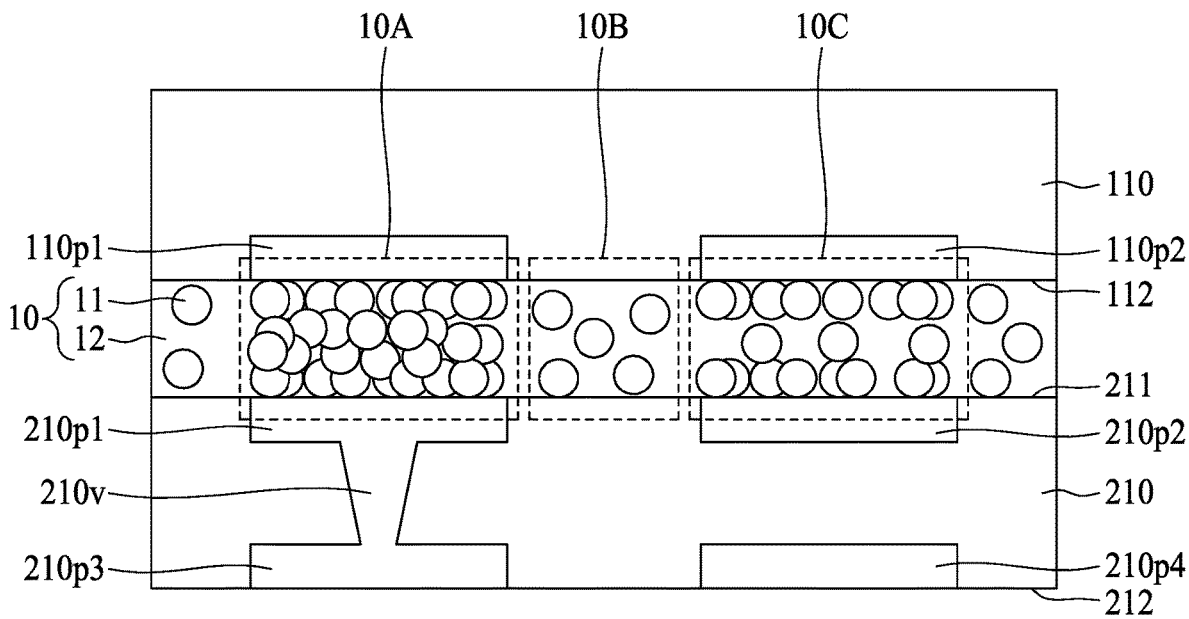
FIG. 1B illustrates an enlarged view of a portion of the semiconductor device package as shown in FIG. 1A, in accordance with some embodiments of the present disclosure.

FIG. 1B illustrates an enlarged view of a portion of the semiconductor device package 1 encircled by a dotted-line square 1A, in accordance with some embodiments of the present disclosure. As shown in FIG. 1B, the connection layer 10 includes a plurality of conductive particles 11 and an adhesion paste 12 covering the conductive particles 11. The conductive particles 11 would move to be close to or adjacent to conductive materials (e.g., conductive pads 110p1, 110p2, 210p1, 210p2, 210p3 and 210p4) after the connection layer 10 is heated to a predetermined temperature and cooled down. In some embodiments, the predetermined temperature is about 140 degrees. In some embodiments, the conductive particles 11 include thermal-aggregation materials. In some embodiments, the conductive particles are solder particles (e.g., SnBi) or any other suitable conductive particles. In some embodiments, the adhesion paste 12 is thermal-cured resin (e.g., epoxy resin). In some embodiments, the adhesive layer 10 is a self-assembly paste (SAP).

As shown in FIG. 1B, the connection layer 10 includes regions 10A, 10B and 10C. The region 10A is between the conductive pad 110*p*1 of the substrate 110 and the conductive pad 210*p*1 of the substrate 210 that is electrically connected to the conductive pad 210*p*3 through a conductive via 210*v*. The region 10B does not overlap any conductive pads of the substrate 110 and the substrate 210. For example, the region 10B is spaced apart from any conductive pads of the substrate 110 and the substrate 210 in a horizontal direction. The region 10C is between the conductive pad 110*p*2 of the substrate 110 and the conductive pad 210*p*2 of the substrate 210 that is not directly connected a conductive via. In some embodiments, the density of the conductive particles 11 (e.g., a ratio of the volume of the conductive particles 11 to the volume of the adhesion paste 12 or a ratio of the number of the conductive particles 11 to the volume of the adhesion paste 12) in the region 10A or 10C is greater than that in the region 10B. In some embodiments, the density of the conductive particles 11 in the region 10A is greater than that in the region 10C. For example, the resistivity between the conductive pads 110*p*1 and 210*p*1 is less than the resistivity between the conductive pads 110*p*2 and 210*p*2. For example, the electrical conductivity between the conductive pads 110*p*1 and 210*p*1 is better than the electrical conductivity between the conductive pads 110*p*2 and 210*p*2.

In some embodiments, the adhesion layer 10 in FIG. 1B may be heated by providing heat from the surface 212 of the substrate 210. For example, the thermal source (e.g., oven) is located adjacent to the surface 212 of the substrate 210. Since the conductive pad 210*p*1 is connected to the conductive pad 210*p*3 disposed at or adjacent to the surface 212 of the substrate 210, the heat may be transferred from the conductive pad 210*p*3 to the conductive pad 210*p*1 through the conductive via 210*v*. However, since the conductive pad 210*p*2 is not directly connected to the conductive pad 210*p*4 through a conductive via, the temperature of the conductive pad 210*p*2 may be lower than the temperature of the conductive pad 210*p*1. Therefore, the density of the conductive particles 11 between the conductive pads 110*p*1 and 210*p*1 (e.g., in the region 10A) is greater than the density of the conductive particles 11 between the conductive pads 110*p*2 and 210*p*2 (e.g., in the region 10C). Such inconsistent conductivities (or resistivity) between conductive pads would adversely affect the performance of the semiconductor device package 1.

Figure 1C:
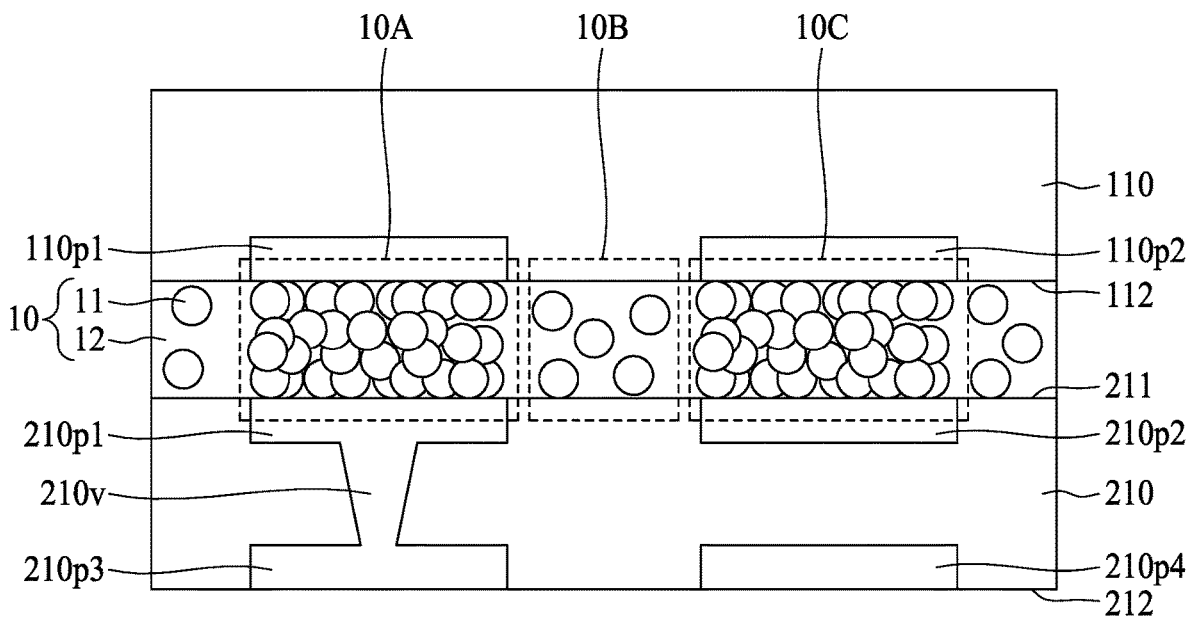
FIG. 1C illustrates an enlarged view of a portion of the semiconductor device package as shown in FIG. 1A, in accordance with some embodiments of the present disclosure.

FIG. 1C illustrates an enlarged view of a portion of the semiconductor device package 1 encircled by a dotted-line square 1A, in accordance with some embodiments of the present disclosure. The structure illustrated in FIG. 1C is similar to that illustrated in FIG. 1B, except that the density of the conductive particles 11 in the region 10A is substantially the same as the density of the conductive particles 11 in the region 10C. For example, the resistivity between the conductive pads 110*p*1 and 210*p*1 is substantially the same as the resistivity between the conductive pads 110*p*2 and 210*p*2. For example, the electrical conductivity between the conductive pads 110*p*1 and 210*p*1 is substantially the same as the electrical conductivity between the conductive pads 110*p*2 and 210*p*2.

In some embodiments, the substrates 110, 210 and the connection layer 10 in FIG. 1C are heated by induction heating. For example, the substrates 110, 210 and the connection layer 10 are applied by rapidly alternating magnetic field, and eddy currents would be generated by the conductive pads (e.g., 110*p*1, 110*p*2, 210*p*1, 210*p*2, 210*p*3 and 210*p*4) to heat those conductive pads. Compared with the embodiments of FIG. 1B, all the conductive pads in FIG. 1C can be evenly heated to a desired temperature, regardless of whether any conductive pad (e.g., 210*p*1) is not connected to another conductive pad (e.g., 210*p*4) disposed at or adjacent to the surface 212 of the substrate 210 through a conductive via. Therefore, all the conductive pads disposed on or adjacent to the surface 211 of the substrate 210 and the corresponding conductive pads disposed on or adjacent to the surface 112 of the substrate 110 have a substantially constant conductivity (or resistivity). This would provide a stable and better electrical connection between the display device 100 and the electronic module 200 (e.g., through the substrate 110, the connection layer 10 and the substrate 210), and in turn improve the electrical performance of the semiconductor device package 1.

In addition, the display device 100 and the electronic module 200 are connected under a relatively low temperature (e.g., 140 degrees) without providing a pressure by using the SAP as the connection layer 10, which would avoid the display device 100 from being damaged during the manufacturing process. Furthermore, using the SAP as the connection layer 10 could provide a precise alignment between the conductive pads of the substrate 110 and the corresponding conductive pads of the substrate 210.

Figure 1D:
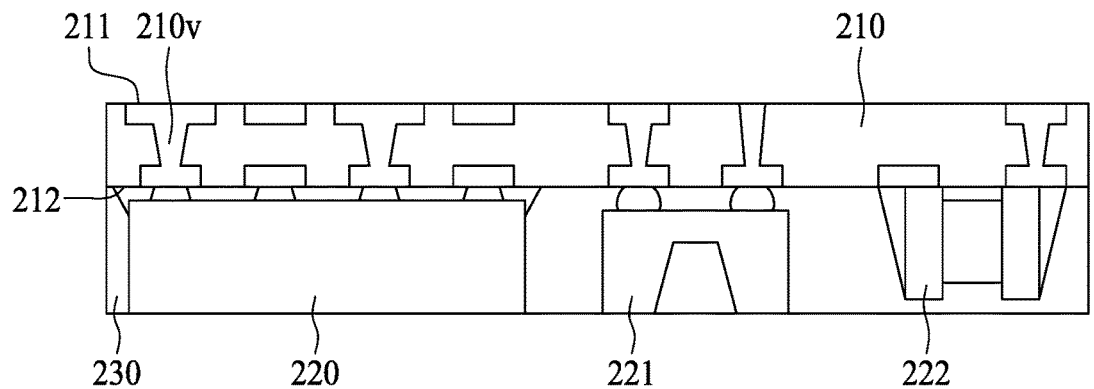
FIG. 1D illustrates a cross-sectional view of an electronic module in accordance with some embodiments of the present disclosure.

FIG. 1D illustrates a cross-sectional view of the electronic module 200 as shown in FIG. 1A, in accordance with some embodiments of the present disclosure. As shown in FIG. 1D, the substrate 210 includes a conductive via 210*v* tapering from the surface 211 toward the surface 212. In addition, a backside surface of the electronic component 220 (e.g., a die or chip) and a backside surface of the electronic component 221 (e.g., a sensor or a MEMS) are exposed from the package body 230. In some embodiments, the electronic module 200 in FIG. 1D may be formed by the following operations: (i) providing a carrier, and placing the backside surfaces of the electronic components 220, 221 and 222 on the carrier; (ii) forming the package body 230 to cover the electronic components 220, 221 and 222; (iii) exposing the active surfaces of the electronic components 220, 221 and 222; and (iv) forming the substrate 210 on the exposed surfaces of the electronic components 220, 221 and 222.

Figure 1E:
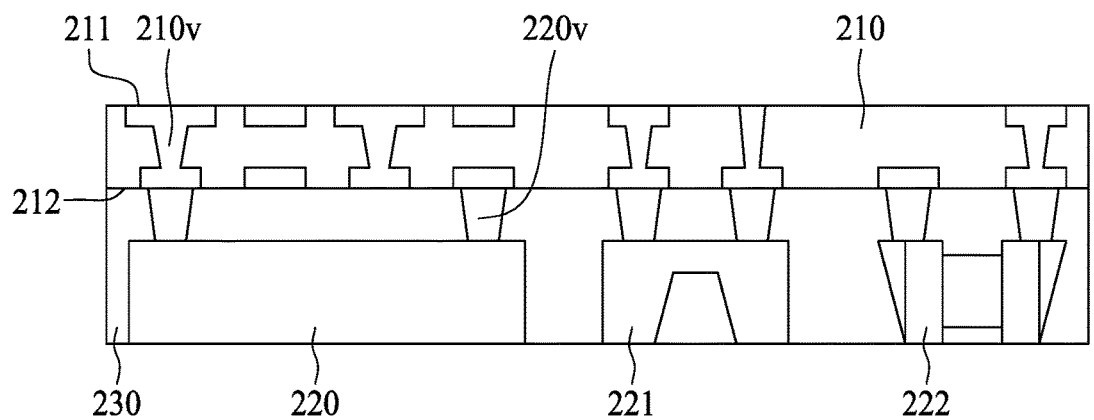
FIG. 1E illustrates a cross-sectional view of an electronic module in accordance with some embodiments of the present disclosure.

FIG. 1E illustrates a cross-sectional view of the electronic module 200 as shown in FIG. 1A, in accordance with some embodiments of the present disclosure. The electronic module illustrated in FIG. 1E is similar to that in FIG. 1D, except that the electronic module in FIG. 1E further includes a conductive via 220*v* connecting the electronic components 220, 221 and 222 to the substrate 210. In some embodiments, the conductive via 220*v* may be formed by: (i) forming an opening to penetrate the package body 230 to expose the active surfaces of the electronic components 220, 221 and 222 by, for example, laser; and (ii) filling the opening with a conductive material.

Figure 1F:
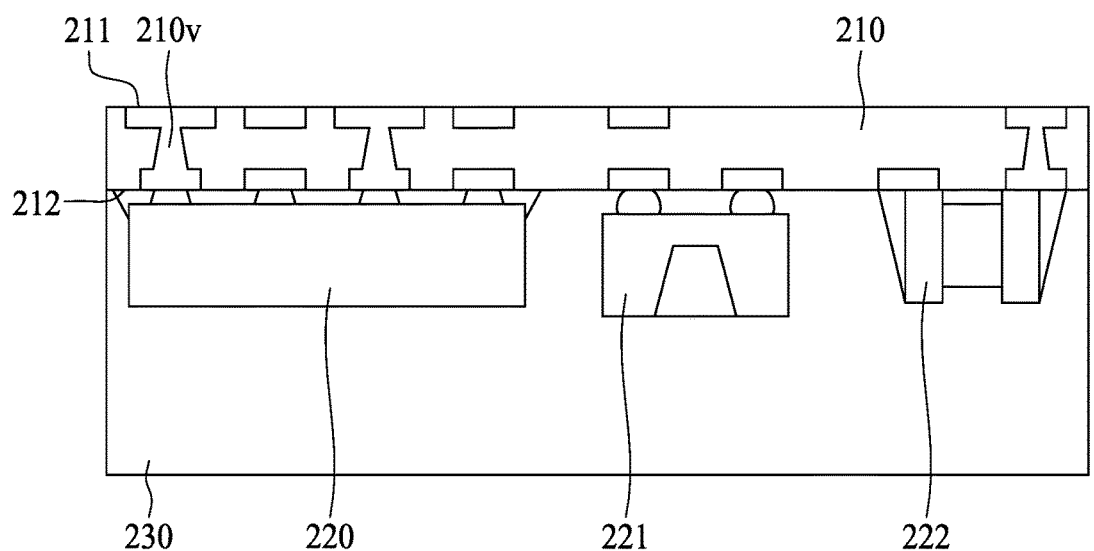
FIG. 1F illustrates a cross-sectional view of an electronic module in accordance with some embodiments of the present disclosure.

FIG. 1F illustrates a cross-sectional view of the electronic module 200 as shown in FIG. 1A, in accordance with some embodiments of the present disclosure. The electronic module illustrated in FIG. 1F is similar to that in FIG. 1D, and the differences therebetween are described below.

The backside surfaces of the electronic components 220, 221 and 222 are covered by the package body 230. The conductive via 210 disposed within the substrate 210 tapers from the surface 212 toward the surface 211. In some embodiments, the electronic module 200 in FIG. 1F may be formed by the following operations: (i) forming the substrate 210; (ii) disposing the electronic components 220, 221 and 222 on the substrate 210; and (iii) forming the package body 230 on the substrate 210 to cover the electronic components 220, 221 and 222.

Figure 2:
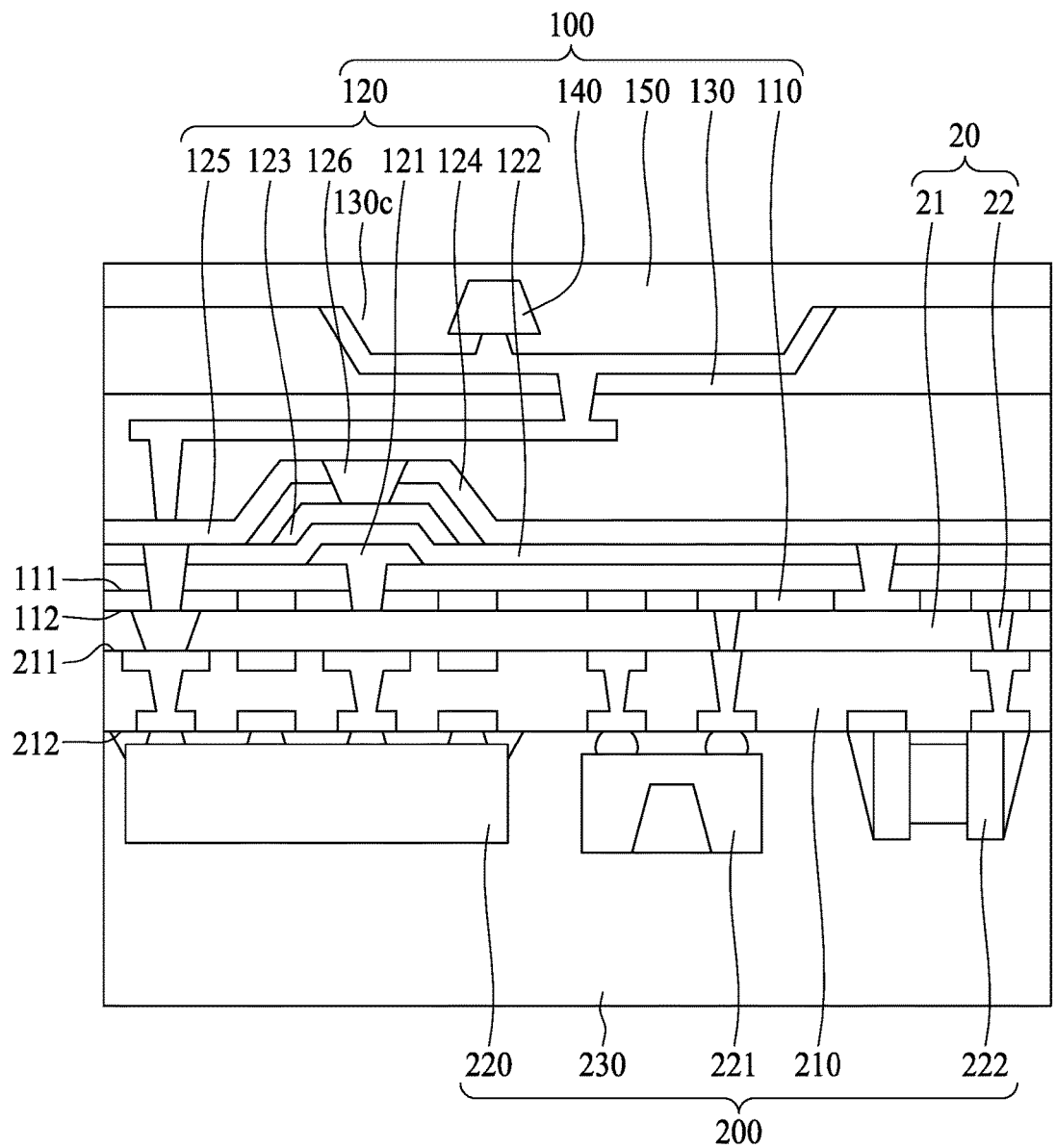
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A, and the differences therebetween are described below.

The display device 100 and the electronic module 200 are connected through a connection layer 20. The connection layer 20 includes an adhesive layer 21 (e.g., adhesion paste) and a plurality of conductive vias 22 penetrating the adhesive layer 21 to electrically connect the conductive pads disposed on or adjacent to the surface 112 of the substrate 110 to the corresponding conductive pads disposed on or adjacent to the surface 211 of the substrate 210. In some embodiments, the adhesive layer 21 may include flexible or elastic materials to provide a buffer when placing the light emitting device 140 within the cavity 130c of the substrate 130.

Figure 3A:
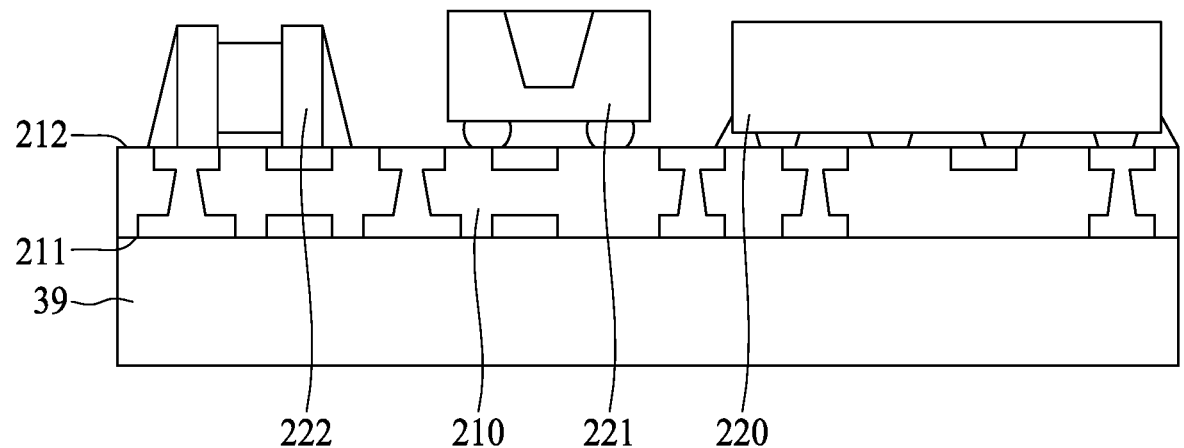
FIG. 3A and FIG. 3B illustrate a method of manufacturing an electronic module in accordance with some embodiments of the present disclosure.
Figure 3B:

FIG. 3A and FIG. 3B are cross-sectional views of an electronic module at various stages of fabrication, in accordance with some embodiments of the present disclosure. At least some of these figures have been simplified for a better understanding of the aspects of the present disclosure. In some embodiments, the operations illustrated in FIGS. 3A and 3B can be used to manufacture the electronic module 200 as shown in FIG. 1A or FIG. 2.

Referring to FIG. 3A, a carrier 39 is provided. A substrate 210 is formed on the carrier 39. In some embodiments, the substrate 210 may be a flexible substrate. The substrate 210 may include an interconnection structure, such as a RDL or a grounding element. The electronic components 220, 221 and 222 are then disposed on the substrate 210 and electrically connected to the substrate 210. In some embodiments, the electronic components 220, 221 and 222 may be formed by, for example, flip-chip technique, surface mount technology (SMT), wire bonding or any other suitable processes.

Referring to FIG. 3B, a package body 230 is formed on the substrate 210 to cover the electronic components 220, 221 and 222. In some embodiments, the package body 230 is formed by molding techniques (e.g., compression molding, transfer molding or the like) or any other suitable processes.

Figure 4B:
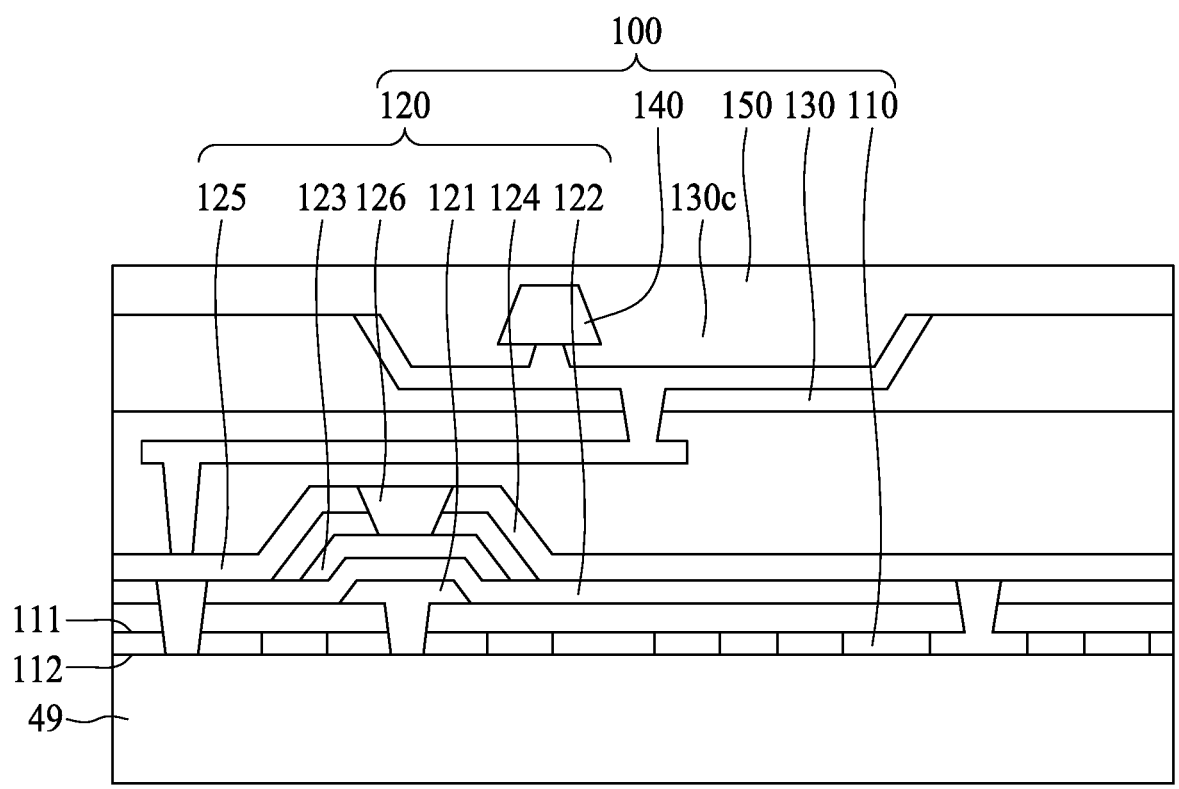
FIG. 4A, FIG. 4A', FIG. 4A" and FIG. 4B illustrate a method of manufacturing a display device in accordance with some embodiments of the present disclosure.

FIG. 4A and FIG. 4B are cross-sectional views of a display device at various stages of fabrication, in accordance with some embodiments of the present disclosure. At least some of these figures have been simplified for a better understanding of the aspects of the present disclosure. In some embodiments, the operations illustrated in FIGS. 4A and 4B can be used to manufacture the display device 100 as shown in FIG. 1A or FIG. 2.

Referring to FIG. 4A, a carrier 49 is provided. A substrate 110 is formed on the carrier 49. In some embodiments, the substrate 110 may be a flexible substrate. The substrate 110 may include an interconnection structure, such as a RDL or a grounding element. The TFT layer 120 is then formed on the substrate 110.

FIG. 4A' and FIG. 4A" illustrate enlarged views of a portion of the substrate 110 and the TFT layer 120 (including an insulation layer 115) as shown in FIG. 4A, in accordance with some embodiments of the present disclosure.

As shown in FIG. 4A', a conductive via 110v is disposed within the substrate 110 and tapers toward a surface of the substrate 110 facing away from an insulation layer 115 of the TFT layer 120. A conductive via 115v is disposed within the insulation layer 115 and tapers toward the substrate 110. For example, the conductive vias 110v and 115v taper in the same direction. The conductive via 110v is electrically connected to the conductive via 115v.

As shown in FIG. 4A", a conductive via 110v is disposed within the substrate 110 and tapers toward the insulation layer 115. A conductive via 115v is disposed within the insulation layer 115 and tapers toward the substrate 110. For example, the conductive vias 110v and 115v taper in opposite directions. The conductive via 110v is electrically connected to the conductive via 115v.

Referring to FIG. 4B, a substrate 130 is formed on the TFT layer 120. The substrate 130 may include an interconnection structure (such as a RDL or a grounding element) to be electrically connected to the TFT layer 120. A cavity 130c is formed on the substrate 130. A light emitting device 140 is disposed within the cavity 130c by, for example, place and pick technique. An encapsulant 150 is then form on the substrate 130 and within the cavity 130c to cover the light emitting device 140.

Figure 5A:
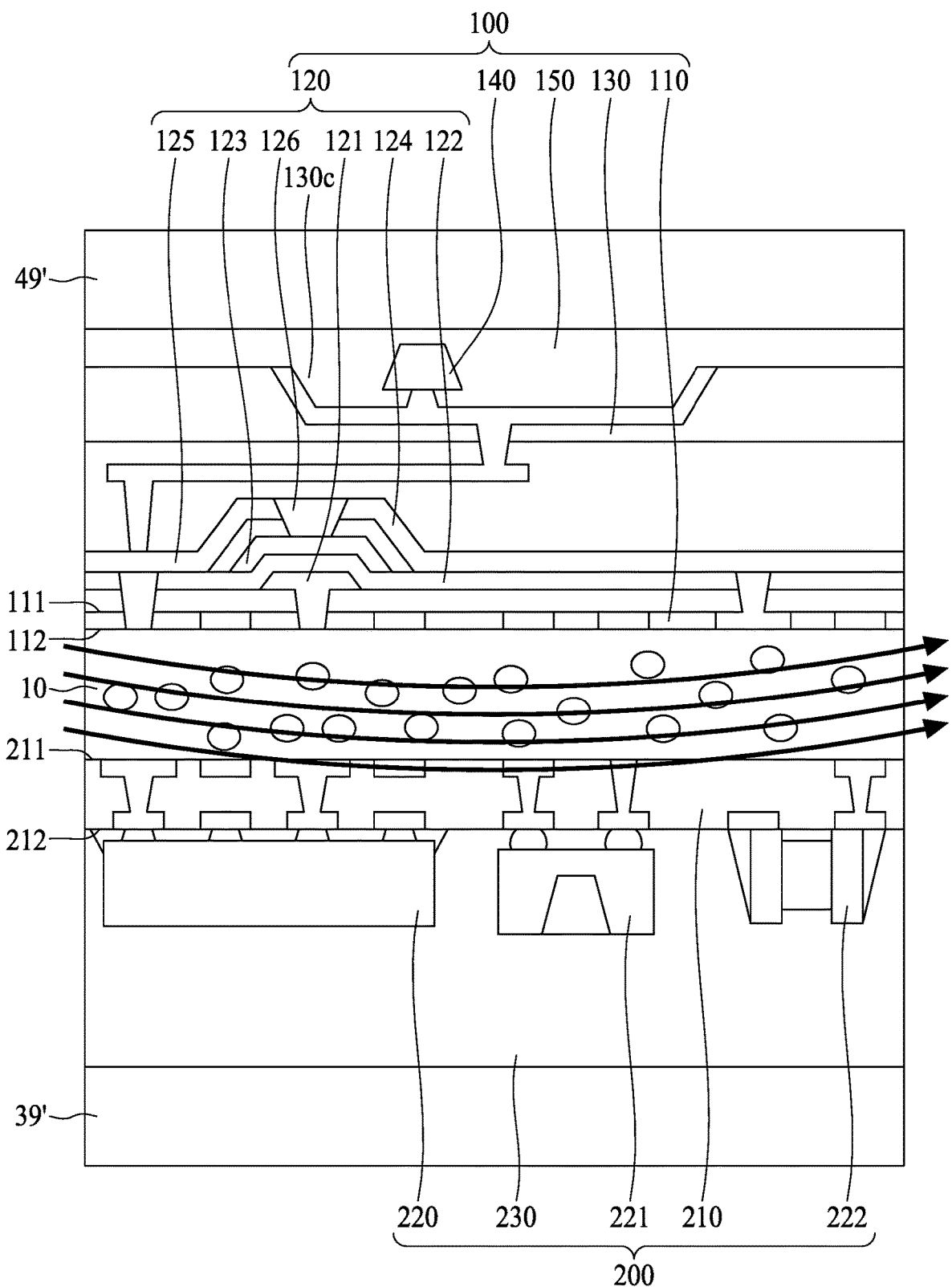
FIG. 5A and FIG. 5B illustrate a method of manufacturing a semiconductor device package in accordance with some embodiments of the present disclosure.
Figure 5B:
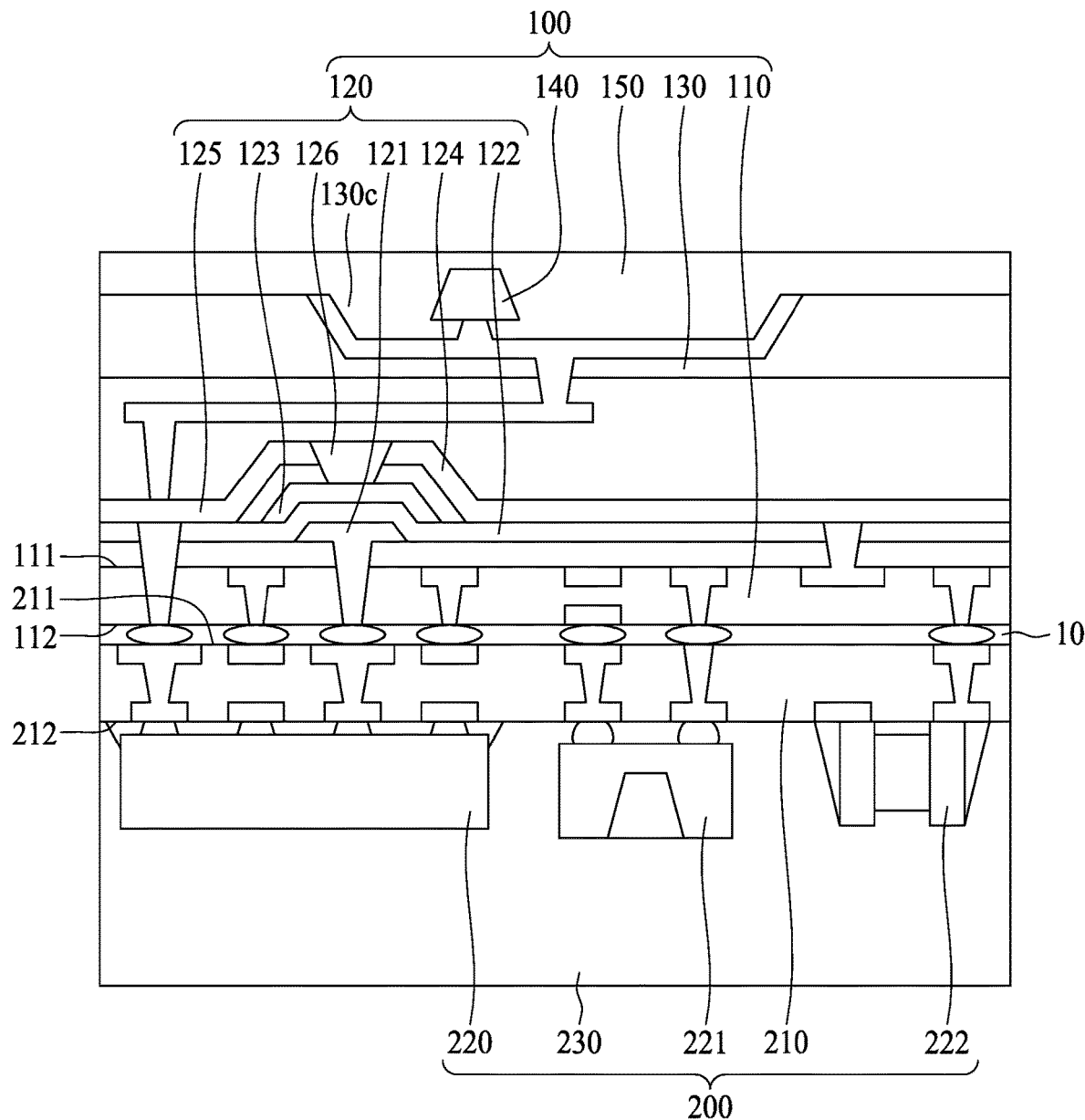

FIG. 5A and FIG. 5B are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIGS. 5A and 5B can be used to manufacture the semiconductor device package 1 as shown in FIG. 1A.

Referring to FIG. 5A, the display device 100 and the electronic module 200 are provided. In some embodiments, the display device 100 and the electronic module 200 can be manufactured by the operations illustrated in FIGS. 4A-4B and FIGS. 5A-5B. For example, the carrier 39 as shown in FIG. 3B is removed, and the package body 230 of the electronic module 200 is disposed on a carrier 39'. For example, the carrier 49 as shown in FIG. 4B is removed, and the encapsulant 150 is disposed on a carrier 49'.

A connection layer 10 (including conductive particles and adhesion paste) is applied between the substrate 110 of the display device 100 and the substrate 210 of the electronic module 200. Then, the display device 100, the electronic module 200 and the connection layer 10 are heated by induction heating. For example, a rapidly alternating magnetic field is applied to the display device 100, the electronic module 200 and the connection layer 10, and eddy currents would be generated by the conductive pads of the substrates 110 and 210 to heat those conductive pads.

As mentioned above, all the conductive pads of the substrate 210 can be evenly heated to a desired temperature (e.g., 140 degrees), regardless of whether any conductive pad is not connected to another conductive pad disposed at or adjacent to the surface 212 of the substrate 210 through a conductive via. Therefore, all the conductive pads disposed on or adjacent to the surface 211 of the substrate 210 and the corresponding conductive pads disposed on or adjacent to the surface 112 of the substrate 110 have a substantially constant conductivity (or resistivity). This would provide a stable and better electrical connection between the display device 100 and the electronic module 200, and in turn improve the electrical performance of the semiconductor device package 1.

Referring to FIG. 5B, the carriers 39' and 49' are removed to form the semiconductor device package 1 as shown in FIG. 1A.

Figure 6A:
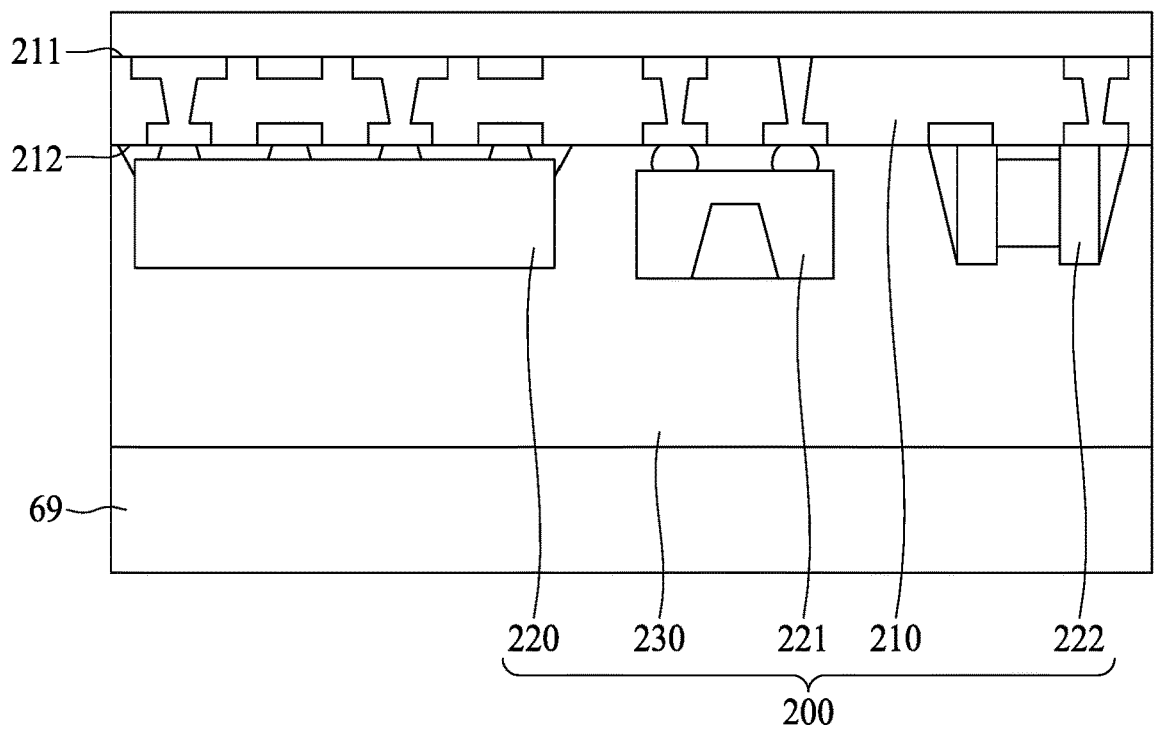
FIG. 6A and FIG. 6B illustrate a method of manufacturing a portion of a semiconductor device package in accordance with some embodiments of the present disclosure.
Figure 6B:
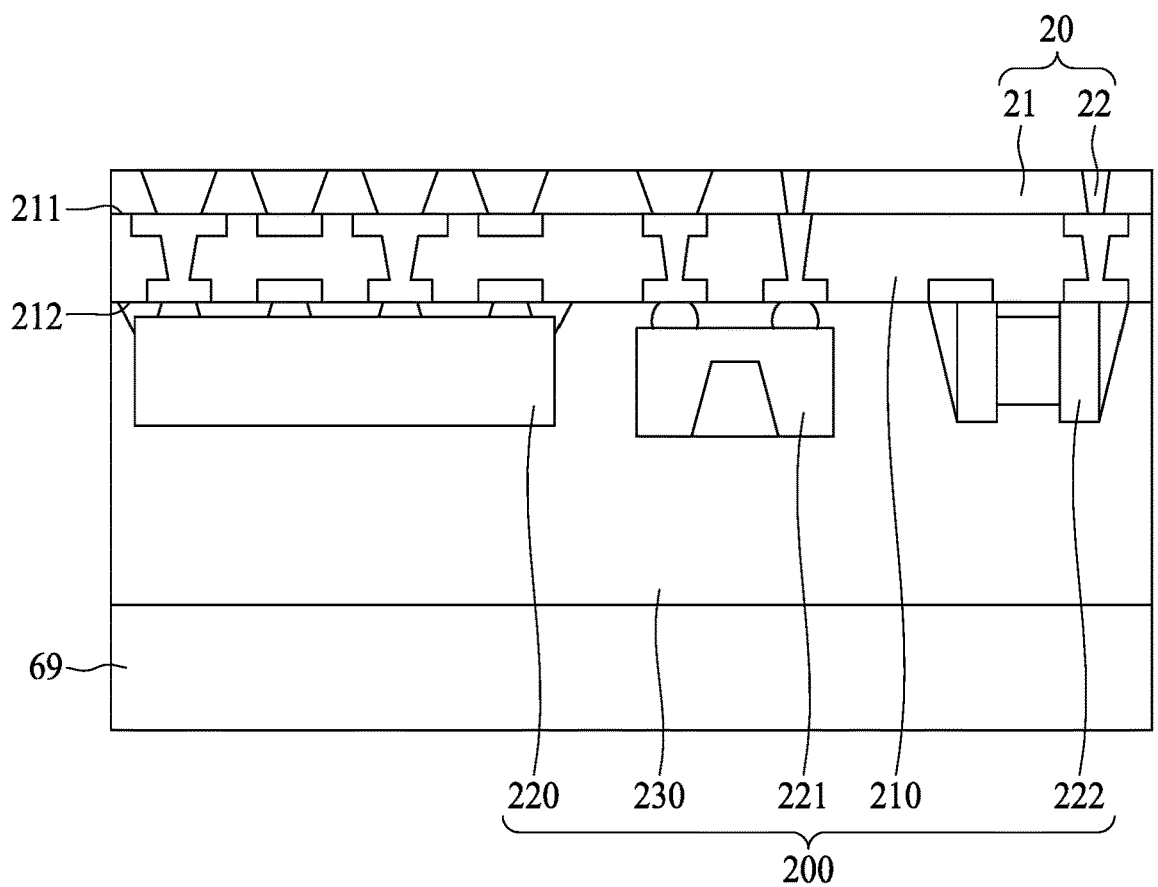

FIG. 6A and FIG. 6B are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIGS. 6A and 6B can be used to manufacture a portion of the semiconductor device package 2 as shown in FIG. 2.

In some embodiments, the operation in FIG. 6A may be carried out after the operation in FIG. 3B. Referring to FIG. 6A, the carrier 39 as shown in FIG. 3B is removed, and the package body 230 of the structure in FIG. 3B is disposed on a carrier 69. An adhesive layer 21 is then formed on the surface 211 of the substrate 210.

Referring to FIG. 6B, a plurality of holes are formed to penetrate the adhesive layer 21 to expose the conductive pads disposed on or adjacent to the surface 211 of the substrate 210. In some embodiments, the holes are formed by, for example, laser drilling or any other suitable processes. A conductive material is then filled within the holes to form the conductive vias 22.

Figure 7A:
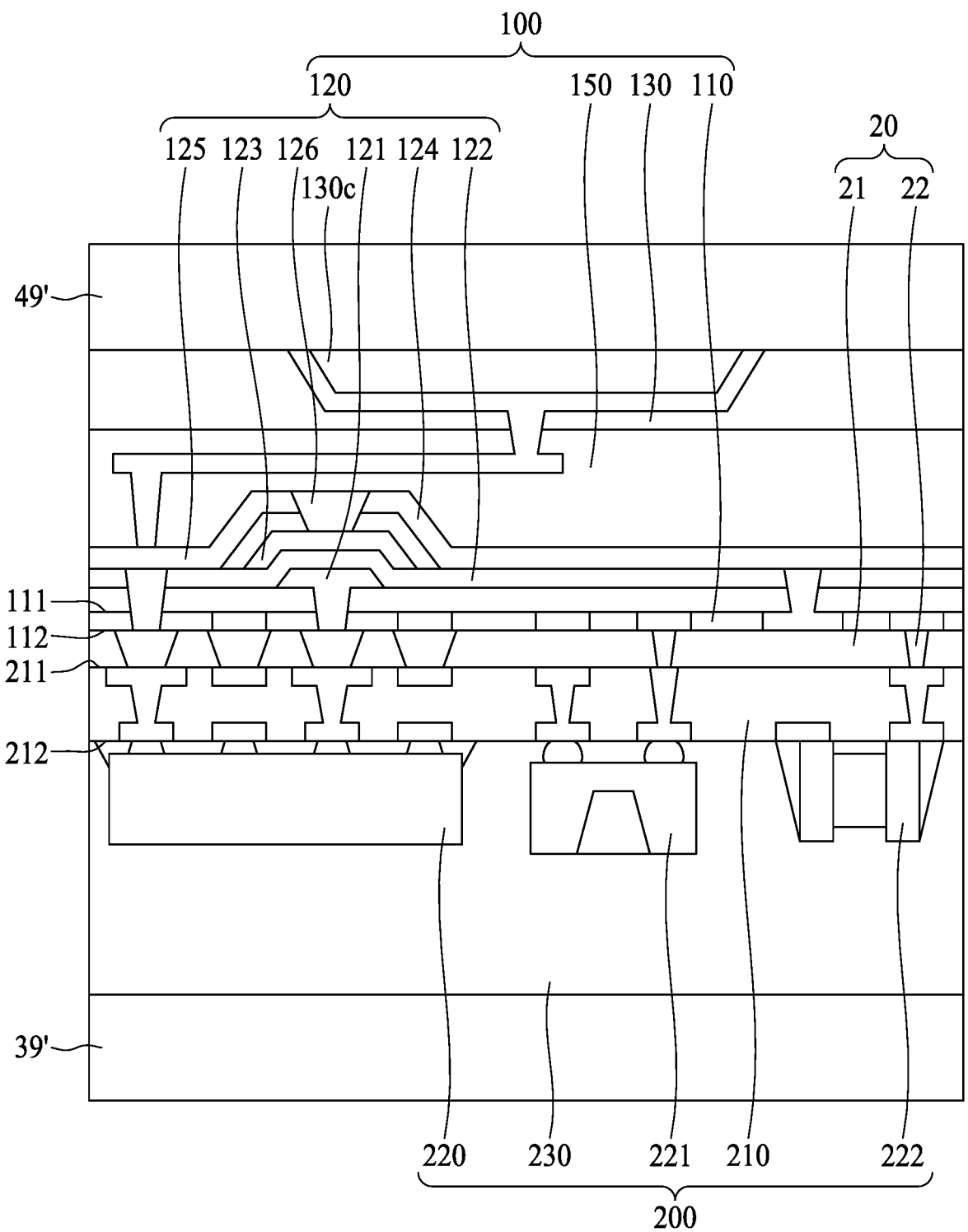
FIG. 7A and FIG. 7B illustrate a method of manufacturing a semiconductor device package in accordance with some embodiments of the present disclosure.
Figure 7B:
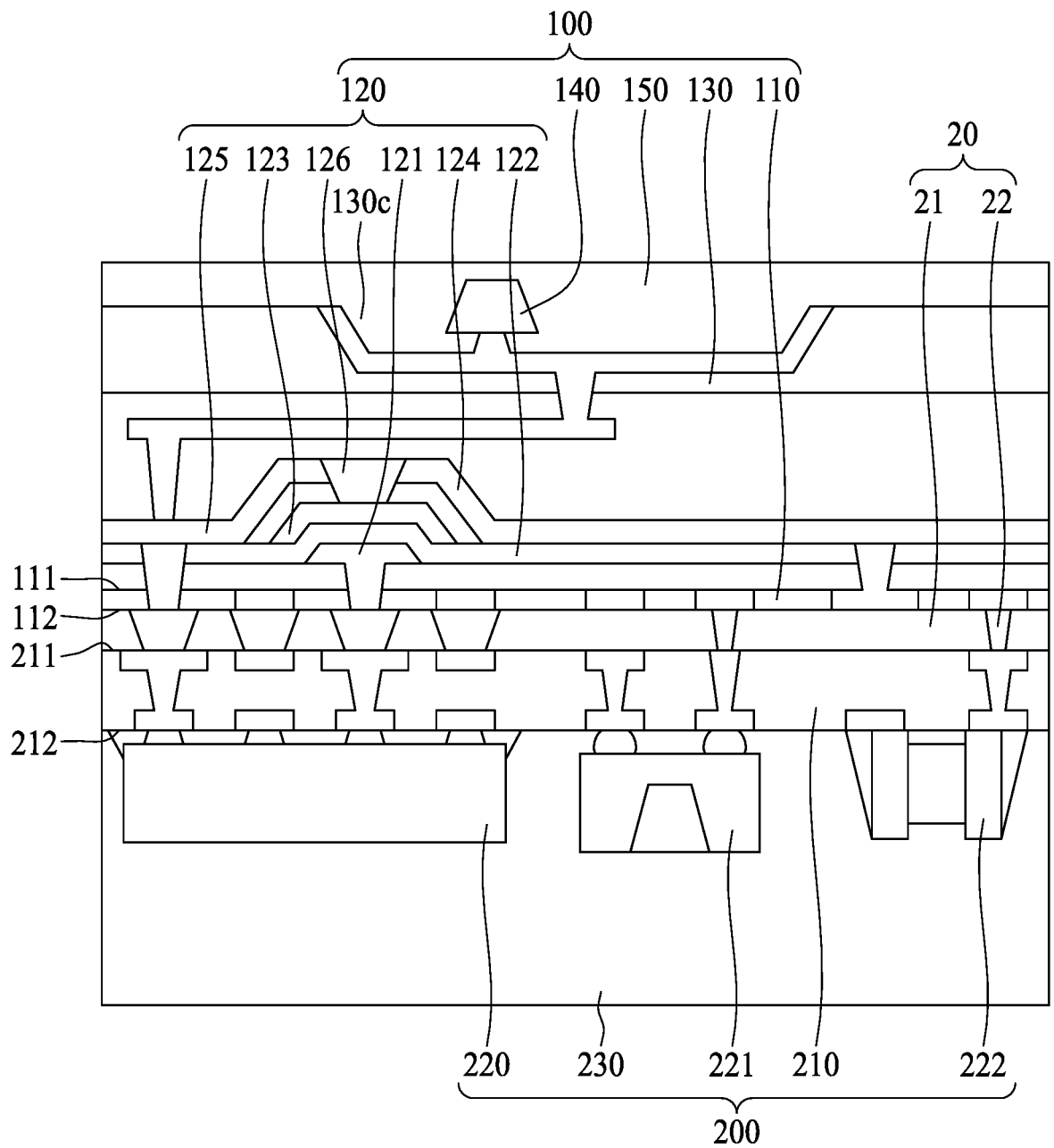

FIG. 7A and FIG. 7B are cross-sectional views of a semiconductor device package at various stages of fabrication, in accordance with some embodiments of the present disclosure. At least some of these figures have been simplified for a better understanding of the aspects of the present disclosure. In some embodiments, the operations illustrated in FIGS. 7A and 7B can be used to manufacture the semiconductor device package 2 as shown in FIG. 2.

Referring to FIG. 7A, a display device and the structure illustrated in FIG. 6B are provided. The display device in FIG. 7A can be formed by the operations in FIG. 4A and FIG. 4B, except that the light emitting device 140 is not disposed within the cavity 130c of the substrate 130. The display device is then connected to the structure illustrated in FIG. 6B by connecting the substrate 110 of the display device to the connection layer 20 (including the adhesive layer 21 and the conductive vias 22). In some embodiments, since the light emitting device 140 is not disposed within the cavity 130c of the substrate 130 before the connection of the display device and the structure illustrated in FIG. 6B, the connection therebetween may be achieved by lamination without damaging the light emitting device 140.

Referring to FIG. 7B, the carriers 39' and 49' are removed. The light emitting device 140 is disposed within the cavity 130c of the substrate 130, and the encapsulant 150 is formed on the substrate 130 and within the cavity 130c to cover the light emitting device 140. In some embodiments, the adhesive layer 21 may include flexible or elastic materials to provide a buffer when placing the light emitting device 140 within the cavity 130c of the substrate 130.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 μm of lying along a same plane, such as within 40 within 30 within 20 within 10 or within 1 μm of lying along the same plane. Two components can be deemed to be "substantially aligned" if, for example, the two components overlap or are within 200 within 150 within 100 within 50 within 40 within 30 within 20 within 10 or within 1 μm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
   a first substrate having a first conductive pad;
   a second substrate having a first conductive pad; and
   a connection layer disposed between the first substrate and the second substrate, wherein the connection layer comprises a plurality of conductive particles;
   wherein the connection layer includes a first region disposed between the first conductive pad of the first substrate and the first conductive pad of the second substrate and a second region spaced apart from the first region in a cross-sectional view of a horizontal direction;
   wherein a density of the conductive particles in the first region is greater than a density of the conductive particles in the second region;

wherein the connection layer further includes a third region disposed between the first substrate and the second substrate, and a density of the conductive particles in the third region is different from the density of the conductive particles in the first region and greater than the density of the conductive particles in the second region; and wherein the first substrate further comprises a second conductive pad spaced apart from the first conductive pad, the second substrate further comprises a second conductive pad spaced apart from the first conductive pad, and the third region is disposed between the second conductive pad of the first substrate and the second conductive pad of the second substrate.

2. The electronic device of claim 1, wherein the second region is between the first region and the third region.

3. The electronic device of claim 1, further comprising a display device including the first substrate, wherein the display device is spaced apart from the second substrate.

4. The electronic device of claim 3, wherein the second substrate comprises a conductive via tapering along a direction from the first substrate to the second substrate.

5. The electronic device of claim 4, wherein the first substrate comprises a conductive via tapering along the direction from the first substrate to the second substrate.

6. The electronic device of claim 3, further comprising an electronic module including the second substrate, wherein the electronic module is electrically connected to the display device through the conductive particles.

7. The electronic device of claim 6, wherein the electronic module comprises a plurality of electronic components and a package body covering the electronic components.

8. The electronic device of claim 6, wherein the electronic device is a bendable device.

9. An electronic device, comprising:
a first substrate having a first conductive pad;
a second substrate having a first conductive pad; and
a connection layer disposed between the first substrate and the second substrate, wherein the connection layer comprises a plurality of conductive particles;
wherein the connection layer includes a first region disposed between the first conductive pad of the first substrate and the first conductive pad of the second substrate and a second region spaced apart from the first region in a cross-sectional view of a horizontal direction;

wherein a resistivity of the first region is less than a resistivity of the second region;

wherein the connection layer further includes a third region disposed between the first substrate and the second substrate, and a resistivity of the third region is different from the resistivity of the first region and less than the resistivity of in the second region; and wherein the first substrate further comprises a second conductive pad spaced apart from the first conductive pad, the second substrate further comprises a second conductive pad spaced apart from the first conductive pad, and the third region is disposed between the second conductive pad of the first substrate and the second conductive pad of the second substrate.

10. The electronic device of claim 9, wherein the second region is between the first region and the third region.

11. The electronic device of claim 9, further comprising a display device including the first substrate, wherein the display device is spaced apart from the second substrate.

12. The electronic device of claim 11, wherein the display device comprises:
a driving circuit disposed on the first substrate; and
a light emitting device disposed above the driving circuit and electrically connected to the driving circuit.

13. The electronic device of claim 11, further comprising a first electronic component disposed under the second substrate and electrically connected to the display device through the conductive particles.

14. The electronic device of claim 13, further comprising a package body covering the first electronic component.

15. The electronic device of claim 14, wherein a bottom surface of the first electronic component is exposed from the package body.

16. The electronic device of claim 15, further comprising a second electronic component disposed under the second substrate, wherein a bottom surface of the second electronic component is covered by the package body.

* * * * *